United States Patent
Motoda

(10) Patent No.: US 8,472,495 B2
(45) Date of Patent: Jun. 25, 2013

(54) LASER DEVICE AND METHOD OF MANUFACTURE THEREOF

(75) Inventor: Takashi Motoda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 4 days.

(21) Appl. No.: 13/402,245

(22) Filed: Feb. 22, 2012

(65) Prior Publication Data
US 2012/0320940 A1 Dec. 20, 2012

(51) Int. Cl.
*H01S 5/00* (2006.01)
(52) U.S. Cl.
USPC .............. 372/50.11; 372/46.016; 372/102
(58) Field of Classification Search
USPC .......................... 372/46.016, 50.11
See application file for complete search history.

(56) References Cited

U.S. PATENT DOCUMENTS

| 4,755,015 A * | 7/1988 | Uno et al. ................. 385/131 |
| 2002/0136255 A1* | 9/2002 | Takayama et al. ............ 372/45 |
| 2004/0165633 A1* | 8/2004 | Tashiro et al. ................ 372/45 |

FOREIGN PATENT DOCUMENTS

| JP | 63-16690 A | 1/1988 |
| JP | 2002-26446 A | 1/2002 |
| JP | 2004-14647 A | 1/2004 |

* cited by examiner

Primary Examiner — Xinning Niu
(74) Attorney, Agent, or Firm — Leydig, Voit & Mayer, Ltd.

(57) ABSTRACT

A laser device includes a substrate, a lower cladding layer on the substrate, an active layer on the lower cladding layer and having a disordered portion spaced from an end face of a resonator of the laser device, an upper cladding layer located on the active layer, and a diffraction grating located in a portion of a layer lying above or below the active layer, with respect to the substrate. The disordered portion intersects a boundary between a diffraction grating section, in which the diffraction grating is located, and a bulk section, in which no diffraction grating is located.

10 Claims, 14 Drawing Sheets

Comparative Example

Comparative Example

LASER DEVICE AND METHOD OF MANUFACTURE THEREOF

BACKGROUND OF THE INVENTION

1. Field of the Invention

The present invention relates to a laser device for use in, e.g., household appliances, etc.

2. Background Art

Japanese Laid-Open Patent Publication No. S63-16690 discloses a laser device in which a diffraction grating is formed in a layer above the active layer so as to achieve wavelength selectivity.

In laser devices having a diffraction grating, the boundary between a region in which the diffraction grating is formed and a region in which the diffraction grating is not formed may experience an increase in optical density. This increase in optical density may result in COD (catastrophic optical damage) to the laser device.

SUMMARY OF THE INVENTION

The present invention has been made to solve the foregoing problem. It is, therefore, an object of the present invention to provide a laser device having a diffraction grating, which is capable of reducing the optical density at the boundary between a region in which the diffraction grating is formed and a region in which the diffraction grating is not formed. Another object of the invention is to provide a method of manufacturing such a laser device.

According to one aspect of the present invention, a laser device includes a substrate, a lower cladding layer formed on the substrate, an active layer formed on the lower cladding layer and having a disordered portion located apart from an end face of the resonator, an upper cladding layer formed on the active layer, and a diffraction grating formed in a portion of a layer lying above or below the active layer. The disordered portion is formed to intersect the boundary between a diffraction grating section in which the diffraction grating is formed and a bulk section in which the diffraction grating is not formed.

According to another aspect of the present invention, a method of manufacturing a laser device includes the steps of forming an active layer on a substrate, forming a diffraction grating in a portion of a layer lying above or below the active layer, and disordering a portion of the active layer. The portion intersecting the boundary between a diffraction grating section in which the diffraction grating is formed and a bulk section in which the diffraction grating is not formed.

According to another aspect of the present invention, a method of manufacturing a laser device includes the steps of forming an active layer on a substrate, forming a disordered portion by disordering a portion of the active layer, and after the forming of the disordered portion, forming a diffraction grating in a portion of a layer lying above the active layer. The diffraction grating forming step includes forming the diffraction grating in such a manner that the disordered portion intersects the boundary between a diffraction grating section in which the diffraction grating is formed and a bulk section in which the diffraction grating is not formed.

Other and further objects, features and advantages of the invention will appear more fully from the following description.

DETAILED DESCRIPTION OF THE PREFERRED EMBODIMENTS

First Embodiment

Figure 1:
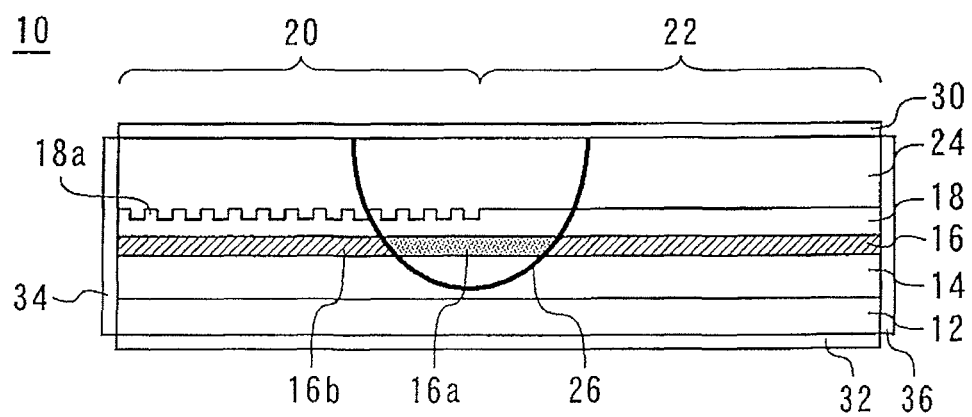
FIG. 1 is a cross-sectional view of a laser device in accordance with a first embodiment of the present invention.

FIG. 1 is a cross-sectional view of a laser device 10 in accordance with a first embodiment of the present invention.

The laser device 10 of the first embodiment includes a substrate 12. The substrate 12 is formed of n-type GaAs. A lower cladding layer 14 is formed on the substrate 12. The lower cladding layer 14 is formed of n-type AlGaAs. An active layer 16 is formed on the lower cladding layer 14. The active layer 16 has a multiquantum well structure. The active layer 16 has a disordered portion 16a which is located apart from the end faces of the resonator. The disordered portion 16a is sandwiched between the two portions of an undisordered portion 16b of the active layer 16.

An upper cladding layer 18 is formed on the active layer 16. The upper cladding layer 18 is formed of p-type AlGaAs. A diffraction grating 18a is formed in a portion of the upper cladding layer 18. The region or portion of the resonator in which the diffraction grating 18a is formed is referred to herein as the diffraction grating section 20. Further, the region or portion of the resonator in which the diffraction grating 18a is not formed is referred to herein as the bulk section 22. The above disordered portion 16a is formed to intersect the boundary between the diffraction grating section 20 and the bulk section 22.

A contact layer 24 is formed on the upper cladding layer 18. The contact layer 24 is formed of p-type AlGaAs. A Zn diffused region 26 is formed along the boundary between the diffraction grating section 20 and the bulk section 22 and extends through the contact layer 24, the upper cladding layer 18, and the active layer 16 into the lower cladding layer 14. The Zn diffused region 26 is formed by diffusion of Zn. As a result of this Zn diffusion, the active layer 16 in the Zn diffused region 26 is disordered by Zn, forming the disordered portion 16a.

An electrode 30 is formed on the contact layer 24. Further, an electrode 32 is formed on the bottom surface of the substrate 12. The front end face of the resonator is covered with an end face coating 34. The rear end face of the resonator is covered with an end face coating 36.

Figure 2:
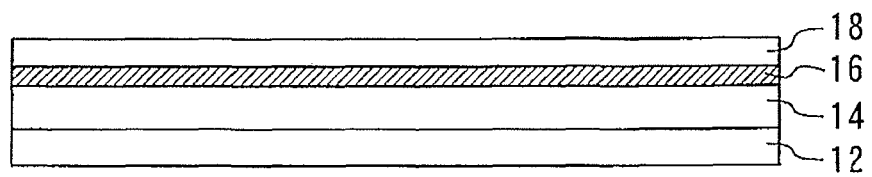
FIG. 2 is a cross-sectional view showing the active layer formed on the substrate.

A method of manufacturing the laser device 10 will now be described. First, the active layer 16 is formed on the substrate. FIG. 2 is a cross-sectional view showing the active layer formed on the substrate. The active layer 16 is sandwiched between the lower cladding layer 14 and the upper cladding layer 18.

Figure 3:
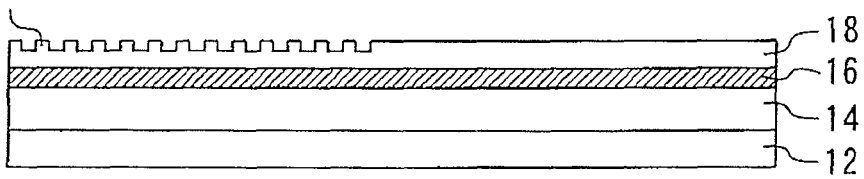
FIG. 3 is a cross-sectional view showing a diffraction grating is formed.

Next, a diffraction grating is formed in a portion of the upper cladding layer 18, which overlies the active layer. FIG. 3 is a cross-sectional view showing a diffraction grating 18a thus formed. The diffraction grating 18a acts to reflect light within the resonator so as to increase the intensity of a particular wavelength of light.

Figure 4:
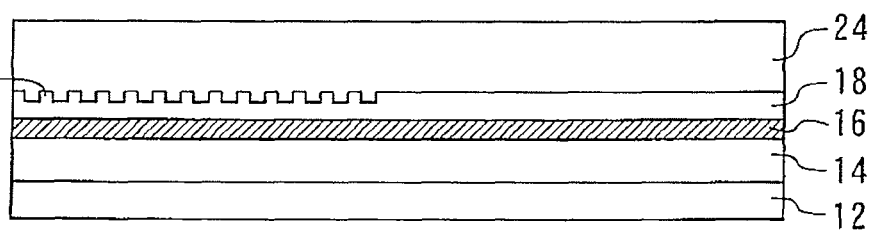
FIG. 4 is a cross-sectional view showing the contact layer is formed.
Figure 5:
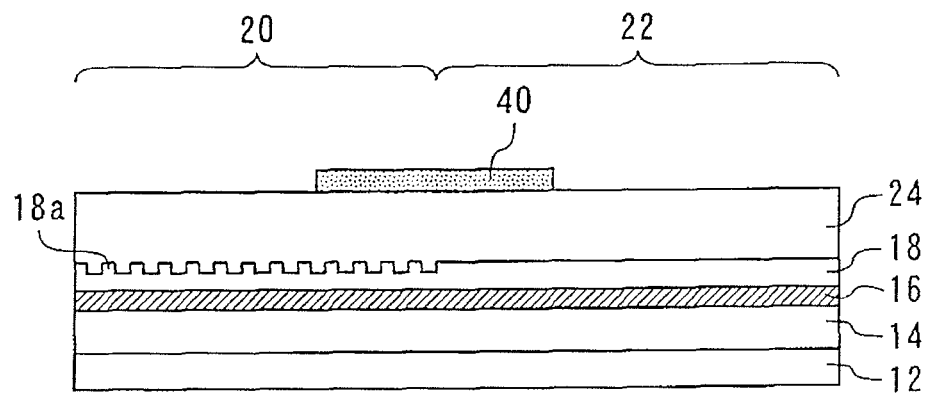
FIG. 5 is a cross-sectional view showing a ZnO film is formed.

The contact layer 24 is then formed on the upper cladding layer 18. FIG. 4 is a cross-sectional view showing the contact layer 24 thus formed. The diffraction grating 18a is buried under the contact layer 24. A ZnO film is then formed on the contact layer. FIG. 5 is a cross-sectional view showing a ZnO film 40 thus formed. The ZnO film 40 is formed above the boundary between the diffraction grating section 20, in which the diffraction grating 18a is formed, and the bulk section 22, in which the diffraction grating 18a is not formed.

Figure 6:
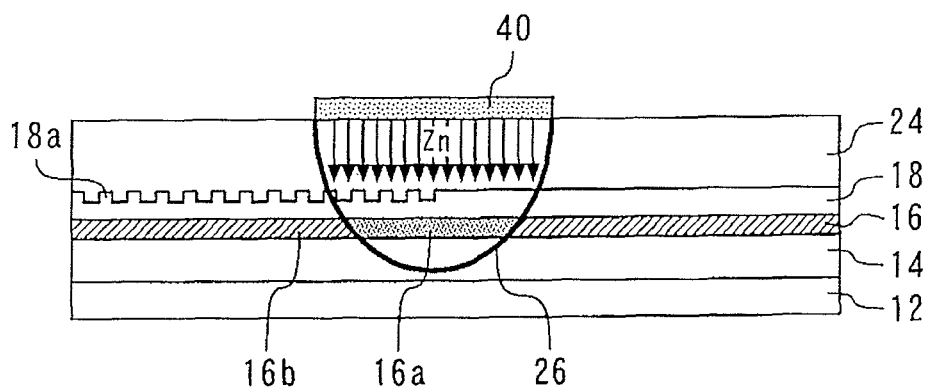
FIG. 6 is a cross-sectional view showing the diffusion of Zn from the ZnO film.

The laser device is then heat treated so that Zn diffuses from the ZnO film 40 into the resonator. FIG. 6 is a cross-sectional view showing the diffusion of Zn from the ZnO film. The Zn diffuses in the direction of the arrows of FIG. 6 and reaches the active layer 16. As a result, the Zn diffused region 26 is formed. Further, a portion of the active layer 16 is disordered by the Zn thus diffused, resulting in the formation of the disordered portion 16a. The disordered portion 16a is formed to intersect the boundary between the diffraction grating section 20, in which the diffraction grating is formed, and the bulk section 22, in which the diffraction grating is not formed. The disordered portion 16a has a greater energy bandgap than the undisordered portion 16b. Therefore, the disordered portion 16a serves as a window structure.

Figure 7:
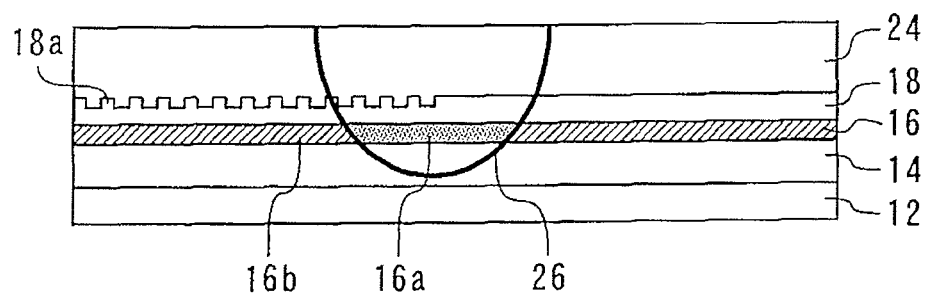
FIG. 7 is a cross-sectional view showing the device after the ZnO film has been removed.
Figure 8:
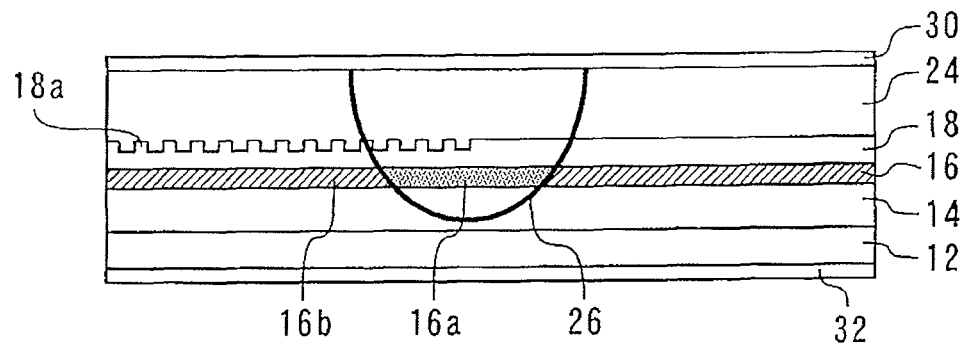
FIG. 8 is a cross-sectional view showing the electrodes after they have been formed.

Next, the ZnO film 40 is removed. FIG. 7 is a cross-sectional view showing the device after the ZnO film has been removed. Then, the electrodes 30 and 32 are formed. FIG. 8 is a cross-sectional view showing the electrodes after they have been formed. Specifically, the electrode 30 is formed on the contact layer 24, and the electrode 32 is formed on the bottom surface of the substrate 12.

A coating is then formed on both end faces of the resonator. Specifically, the end face coating 34 is formed on the front end face of the resonator, and the end face coating 36 is formed on the rear end face of the resonator. This completes the manufacture of the laser device 10 shown in FIG. 1.

Figure 9A:
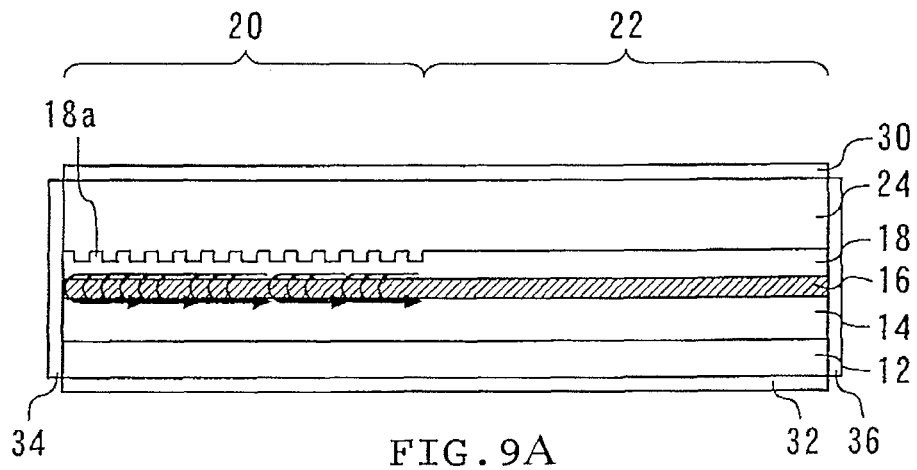
FIG. 9 shows a comparative laser device.
Figure 9B:
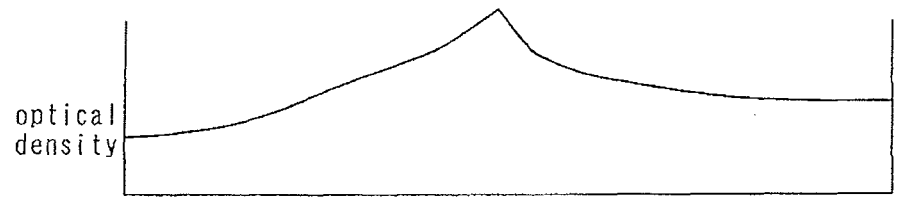

In order to facilitate the understanding of the laser device 10 of the first embodiment, the following description will be directed to a comparative example. FIG. 9 (which includes FIGS. 9A and 9B) shows a comparative laser device. As shown in FIG. 9A, the active layer of this comparative laser device does not have a disordered portion formed therein. In the comparative laser device, the optical density is maximized at the boundary between the diffraction grating section 20 and the bulk section 22 due to the light reflection by the diffraction grating 18a. FIG. 9B shows that the optical density is maximized at the boundary between the diffraction grating section 20 and the bulk section 22. In the case of the comparative laser device, the optical density at the boundary may increase to such an extent that the device suffers COD. Especially when the laser device is operated at high output, the chances of COD are increased.

In the case of the laser device 10 of the first embodiment, on the other hand, the light absorption at the boundary between the diffraction grating section 20 and the bulk section 22 can be reduced, since the disordered portion 16a is formed to intersect the boundary. This means that it is possible to reduce the optical density at the boundary between the diffraction grating section 20 and the bulk section 22 and thereby enhance the prevention of COD to the laser device 10.

The laser device of the first embodiment is characterized in that the disordered portion 16a is formed to intersect the boundary between the diffraction grating section 20, in which the diffraction grating 18a is formed, and the bulk section 22, in which the diffraction grating is not formed. A variety of alterations can be made to the laser device of the first embodiment as long as this feature is retained.

Although in the above example the laser device 10 of the first embodiment is formed of GaAs/AlGaAs-based materials, it is to be understood that the laser device may be formed of, e.g., InP/InGaAsP-based materials or GaAs/AlGaInP-based materials.

Although the foregoing description does not describe the details of the epitaxial structure of the active layer, etc. in order to facilitate the understanding of the present invention, it is to be understood that the active layer may have a SQW (single quantum well) structure or a MQW (multiquantum well) structure. Further, a band discontinuity reduction layer may be formed between the upper cladding layer and the contact layer in order to reduce the bandgap between these layers.

Figure 10:
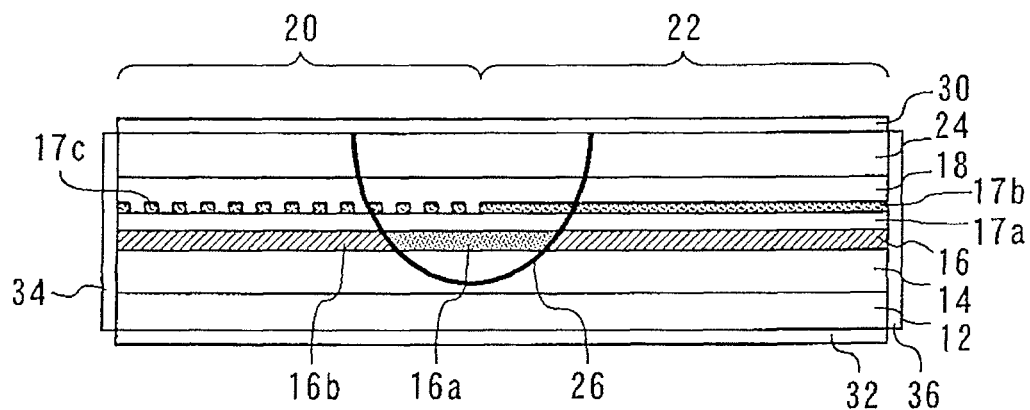
FIG. 10 is a cross-sectional view showing a laser device having a diffraction grating formed in a light guiding layer thereof.

Further, the diffraction grating 18a may be formed in a layer other than the upper cladding layer 18. For example, a light guiding layer may be formed in the laser device, and a diffraction grating may be formed in this light guiding layer. FIG. 10 is a cross-sectional view showing a laser device having a diffraction grating formed in a light guiding layer thereof. In this laser device, a first light guiding layer 17a and a second light guiding layer 17b are provided between the active layer 16 and the upper cladding layer 18. A diffraction grating 17c is formed in the second light guiding layer 17b. In this case, there is no need to form a diffraction grating in the upper cladding layer 18.

Figure 11:
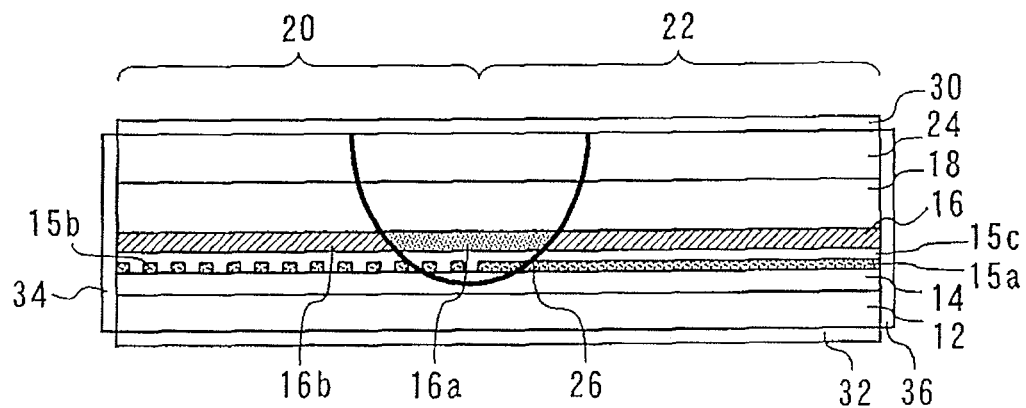
FIG. 11 is a cross-sectional view showing a laser device in which a diffraction grating is formed in a light guiding layer below the active layer.

The diffraction grating need not necessarily be formed in a layer above the active layer, but may be formed in a portion of a layer below the active layer. FIG. 11 is a cross-sectional view showing a laser device in which a diffraction grating is formed in a light guiding layer below the active layer. In this laser device, a first light guiding layer 15a and a second light guiding layer 15c are provided between the active layer 16 and the lower cladding layer 14. A diffraction grating 15b is formed in the first light guiding layer 15a. In this case, there is no need to form a diffraction grating in the upper cladding layer 18.

Second Embodiment

Figure 12:
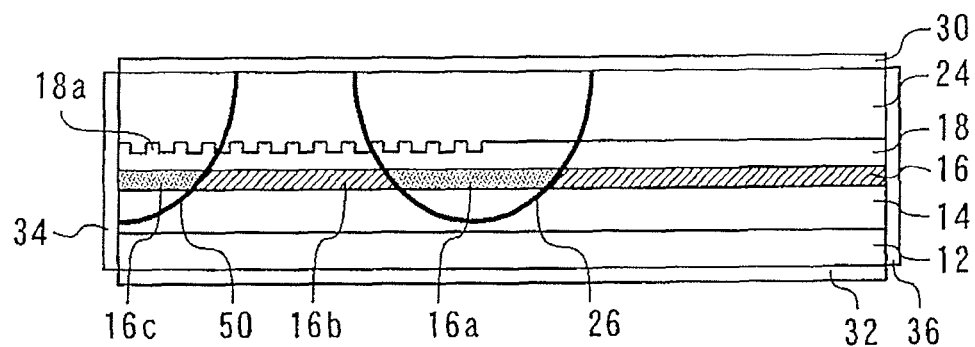
FIG. 12 is a cross-sectional view of a laser device in accordance with a second embodiment of the present invention.

FIG. 12 is a cross-sectional view of a laser device in accordance with a second embodiment of the present invention. The following description of this laser device will be directed only to the differences from the laser device 10 described above. A Zn diffused region 50 is formed in the front end of the laser device. As a result, the active layer 16 in the Zn diffused region 50 is disordered, forming a disordered end portion 16c. Thus the disordered end portion 16c of the active layer 16 is formed in the front end of the resonator.

Figure 13:
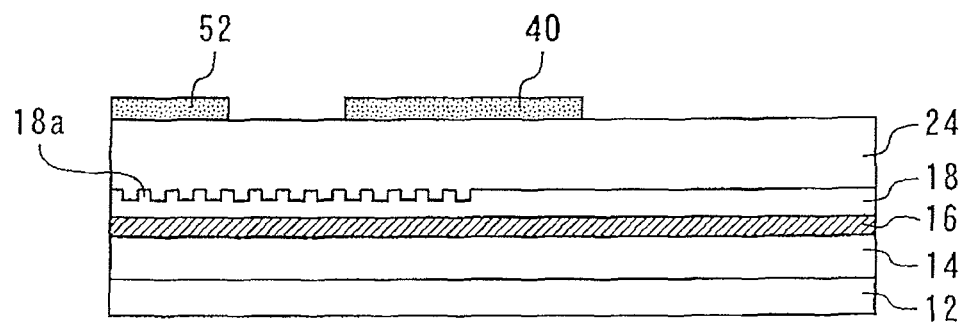
FIG. 13 is a cross-sectional view showing ZnO films after they have been formed.
Figure 14:
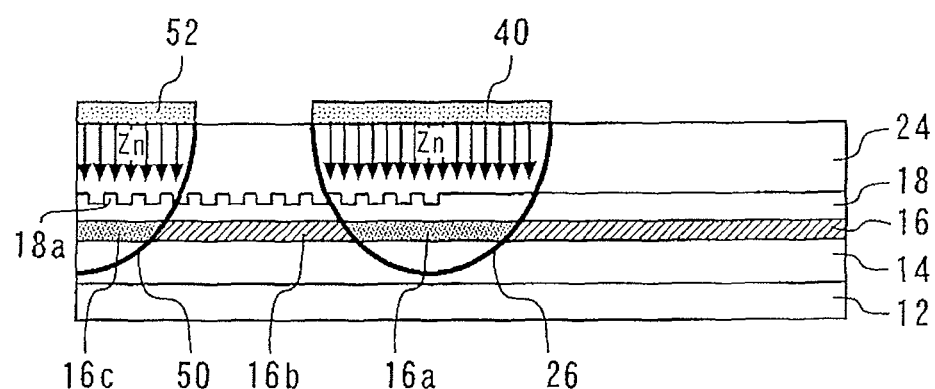
FIG. 14 is a cross-sectional view showing the Zn diffusion from the ZnO films.

The following description of a method of manufacturing a laser device in accordance with the second embodiment will be directed only to the differences from the method of manufacturing a laser device in accordance with the first embodiment. FIG. 13 is a cross-sectional view showing ZnO films after they have been formed. Specifically, a ZnO film 52 is formed on the front end of the resonator. This laser device is then heated so that Zn diffuses from the ZnO films. FIG. 14 is a cross-sectional view showing the Zn diffusion from the ZnO films. Specifically, Zn diffuses from the ZnO film 52 toward the substrate, thereby forming the Zn diffused region 50. It should be noted that the Zn diffused region 26 described above in connection with the first embodiment is also foamed in this step.

In the laser device of the second embodiment, not only is the disordered portion 16a formed to intersect the boundary between the diffraction grating section 20 and the bulk section 22, but also the active layer in the front end of the resonator is disordered to form the disordered end portion 16c. This makes it possible to prevent COD to the front end face of the resonator, as well as COD to the boundary between the diffraction grating section 20 and the bulk section 22.

Figure 15:
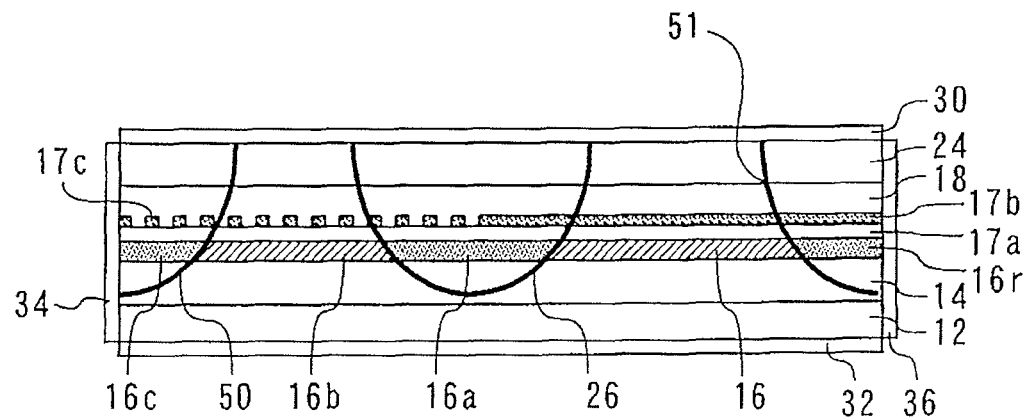
FIG. 15 is a cross-sectional view showing a laser device in which a disordered end portion is also formed in the rear end of the resonator.

In the laser device of the second embodiment, the disordered end portion 16c is formed in the front end of the resonator. It is to be understood, however, that a disordered end portion may also be formed in the rear end of the resonator if COD might occur to the rear end face. FIG. 15 is a cross-sectional view showing a laser device in which a disordered end portion is also formed in the rear end of the resonator. As shown, as a result of the formation of a Zn diffused region 51, the active layer 16 in the Zn diffused region 51 is disordered, forming a disordered end portion 16r. The disordered end portion 16r may be formed in the same process which forms the disordered end portion 16c. It should be noted that the laser device of the second embodiment is susceptible of at least alterations similar to those that can be made to the laser device of the first embodiment.

Third Embodiment

Figure 16:
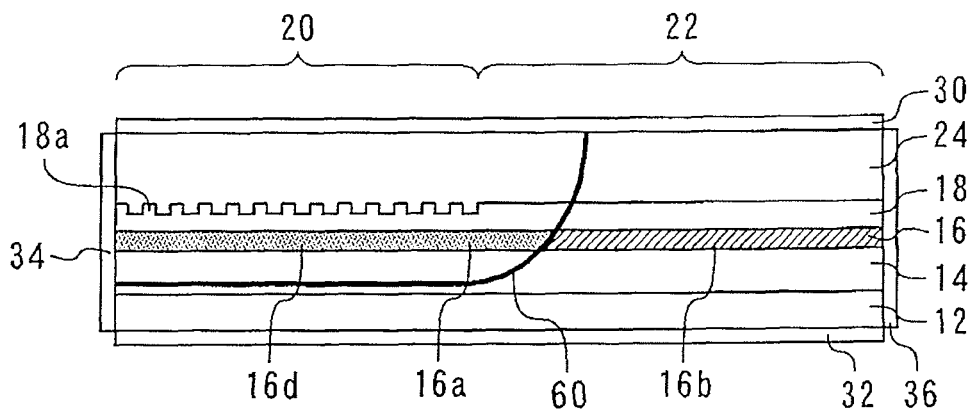
FIG. 16 is a cross-sectional view showing a laser device in accordance with a third embodiment of the present invention.

FIG. 16 is a cross-sectional view showing a laser device in accordance with a third embodiment of the present invention. The following description of this laser device will be directed only to the differences from the laser device 10 described above. A Zn diffused region 60 is formed in the diffraction grating section 20 and the boundary between the diffraction grating section 20 and the bulk section 22. As a result, the active layer 16 in the Zn diffused region 60 is disordered, forming the disordered portion 16a and a disordered under-diffraction-grating portion 16d. The disordered under-diffraction-grating portion 16d is the disordered portion of the active layer 16 directly below the diffraction grating 18a.

Figure 17:
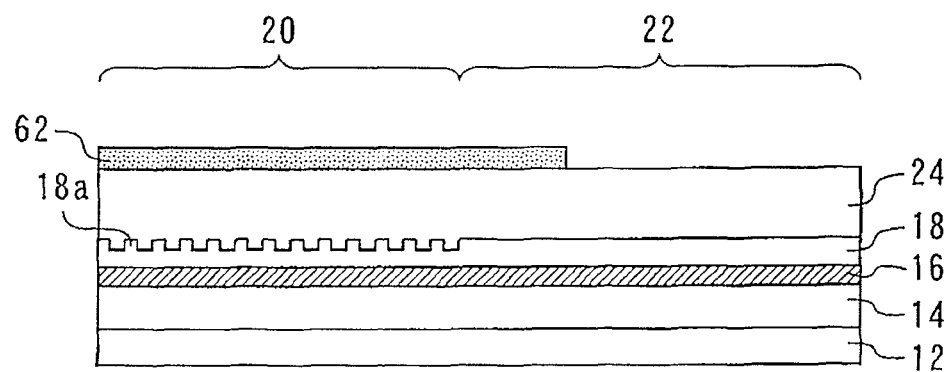
FIG. 17 is a cross-sectional view showing a ZnO film after it has been formed.
Figure 18:
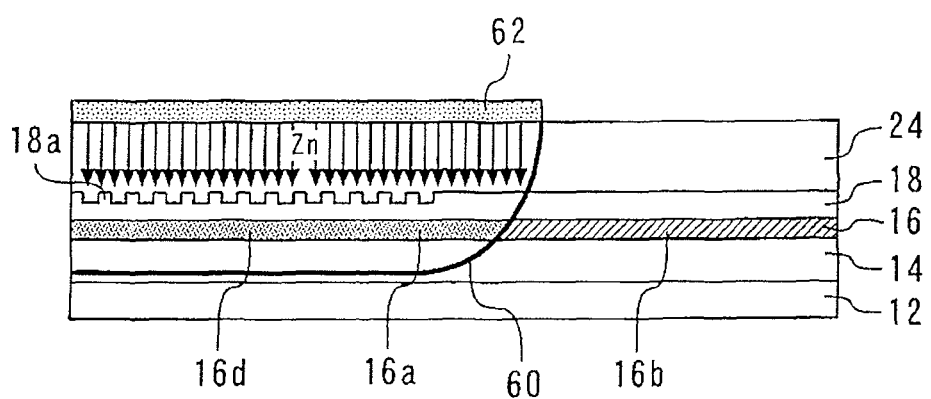
FIG. 18 is a cross-sectional view showing the Zn diffusion from the ZnO film.

The following description of a method of manufacturing a laser device in accordance with the third embodiment will be directed only to the differences from the method of manufacturing a laser device in accordance with the first embodiment. FIG. 17 is a cross-sectional view showing a ZnO film 62 after it has been formed. The ZnO film 62 is formed directly above the diffraction grating 18a and on the boundary between the diffraction grating section 20 and the bulk section 22. This laser device is then heated so that Zn diffuses from the ZnO film 62. FIG. 18 is a cross-sectional view showing the Zn diffusion from the ZnO film 62. As shown in FIG. 18, Zn diffuses from the ZnO film 62 toward the substrate, thereby forming the Zn diffused region 60.

In the laser device of the third embodiment, the portions of the active layer directly below the diffraction grating section 20 and in the boundary between the diffraction grating section 20 and the bulk section 22 are disordered, thereby preventing COD to these portions. It should be noted that the diffraction grating may be formed in a layer below the active layer. In such a case, the portion of the active layer directly above the diffraction grating section is disordered. It should be noted that the laser device of the third embodiment is susceptible of at least alterations similar to those that can be made to the laser devices of the embodiments described above.

Fourth Embodiment

Figure 19:
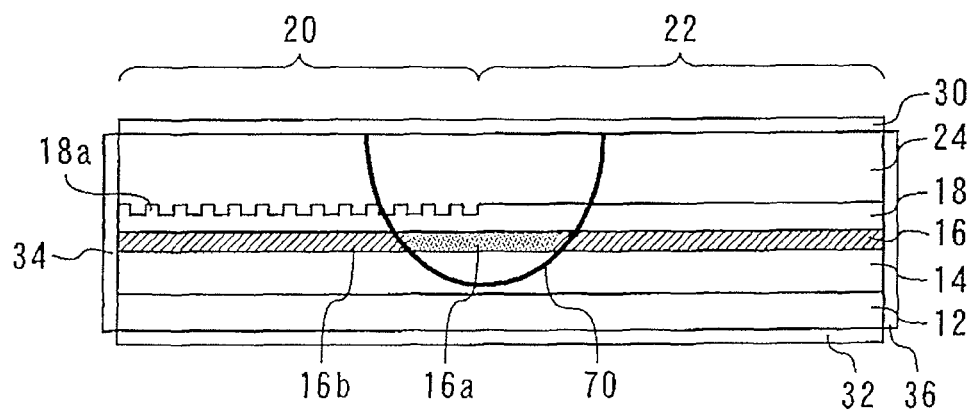
FIG. 19 is a cross-sectional view showing a laser device in accordance with a fourth embodiment of the present invention.

FIG. 19 is a cross-sectional view showing a laser device in accordance with a fourth embodiment of the present invention. The following description of this laser device will be directed only to the differences from the laser device 10 described above. An Si diffused region 70 is formed along the boundary between the diffraction grating section 20 and the bulk section 22 and extends through the contact layer 24, the upper cladding layer 18, and the active layer 16 into the lower cladding layer 14. As a result of the Si diffusion, the active layer in the Si diffused region 70 is disordered, forming the disordered portion 16a.

Figure 20:
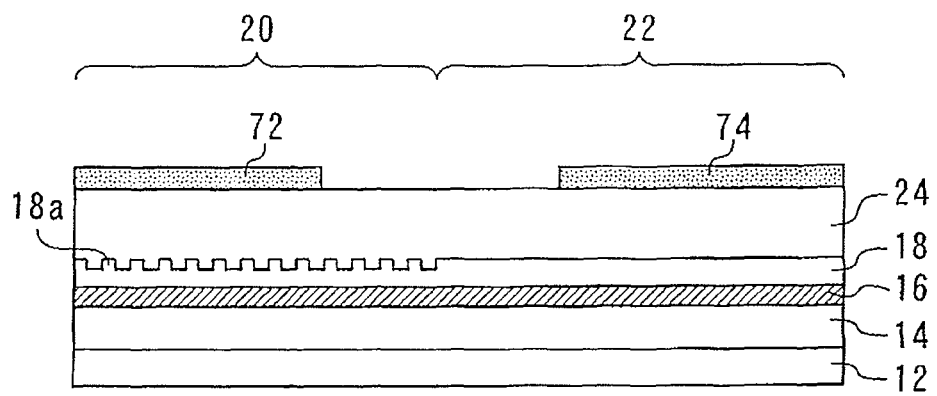
FIG. 20 is a cross-sectional view showing mask films after they have been formed.

The following description of a method of manufacturing a laser device in accordance with the fourth embodiment will be directed only to the differences from the method of manufacturing a laser device in accordance with the first embodiment. FIG. 20 is a cross-sectional view showing mask films after they have been formed. Specifically, a mask film 72 and a mask film 74 are formed on the contact layer 24 and sandwiches the boundary between the diffraction grating section 20 and the bulk section 22. It should be noted that the mask films 72 and 74 do not lie on the boundary.

Figure 21:
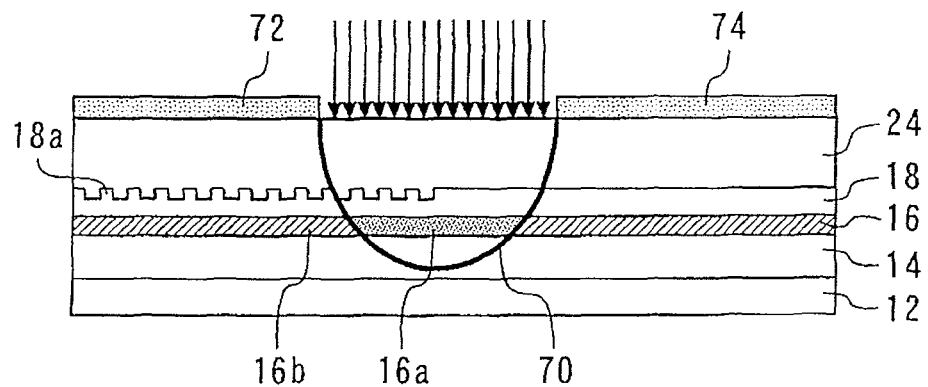
FIG. 21 is a cross-sectional view showing the Si ion implantation.

Next, Si ions are implanted using the mask films 72 and 74 as masks. FIG. 21 is a cross-sectional view showing the Si ion implantation. Si ions are implanted in the direction of the arrows, thereby forming the Si diffused region 70. As a result, the active layer 16 in the region 70 is disordered, forming the disordered portion 16a. Thus by means of Si ion implantation it is possible to form the disordered portion 16a, which intersects the boundary between the diffraction grating section 20 and the bulk section 22.

Figure 22:
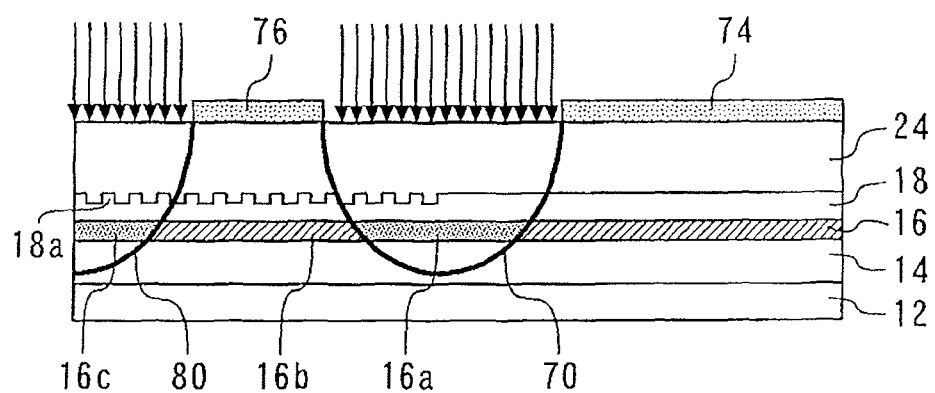
FIG. 22 is a cross-sectional view showing a disordered portion formed in an end of the resonator by Si ion implantation.

Various alterations may be made to the laser device of the fourth embodiment. For example, a disordered portion may be foamed in an end of the resonator. FIG. 22 is a cross-sectional view showing a disordered portion formed in an end of the resonator by Si ion implantation. Specifically, an Si diffused region 80 is formed by implanting Si ions in the end of the resonator using mask films 74 and 76 as masks. As a result, the active layer 16 in the Si diffused region 80 is disordered, forming the disordered end portion 16c.

Figure 23:
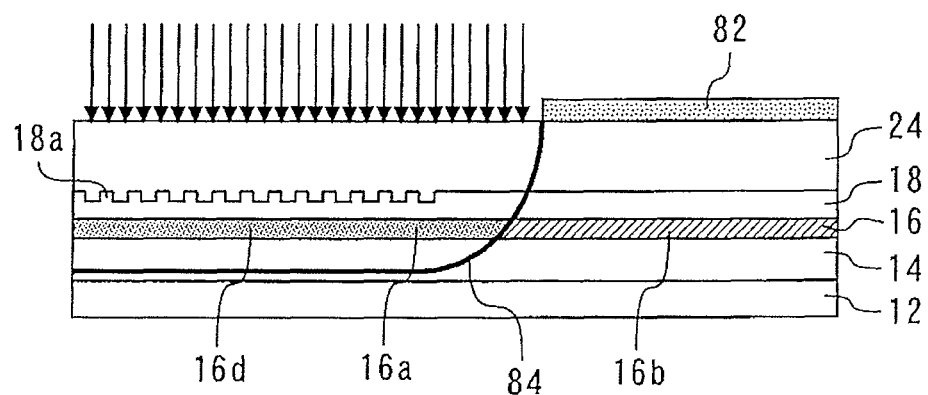
FIG. 23 is a cross-sectional view showing a disordered under-diffraction-grating portion formed by Si ion implantation.

Further, a disordered under-diffraction-grating portion may be formed by means of Si ion implantation. FIG. 23 is a cross-sectional view showing a disordered under-diffraction-grating portion formed by Si ion implantation. Specifically, an Si diffused region 84 is formed by implanting Si ions in the diffraction grating section 20 using a mask film 82 as a mask. As a result, the active layer 16 below the diffraction grating 18a is disordered, forming the disordered under-diffraction-grating portion 16d. It should be noted that the laser device of the fourth embodiment is susceptible of at least alterations similar to those that can be made to the laser devices of the embodiments described above.

Fifth Embodiment

A method of manufacturing a laser device in accordance with a fifth embodiment of the present invention is characterized in that a diffraction grating is formed after a disordered portion is formed in the active layer. The following description of this method will be primarily directed to the differences from the method of manufacturing the laser device 10 described above.

Figure 24:
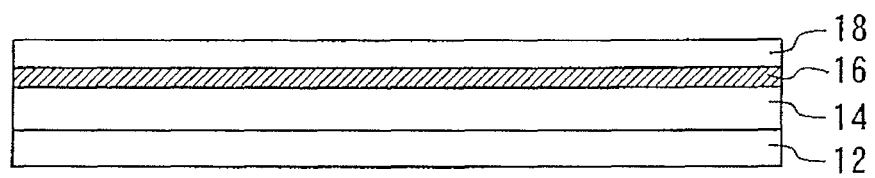
FIG. 24 is a cross-sectional view showing the active layer formed on the substrate.

FIG. 24 is a cross-sectional view showing the active layer formed on the substrate. Specifically, first, the active layer 16 is formed on the substrate 12. The active layer 16 is sandwiched between the lower cladding layer 14 and the upper cladding layer 18.

Figure 25:
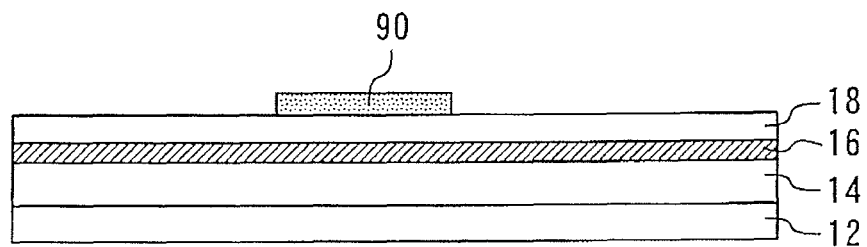
FIG. 25 is a cross-sectional view showing a ZnO film is formed.
Figure 26:
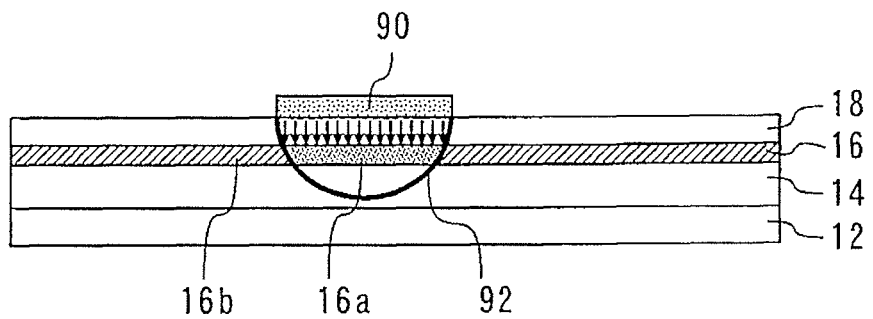
FIG. 26 is a cross-sectional view showing a Zn diffused region is formed.
Figure 27:
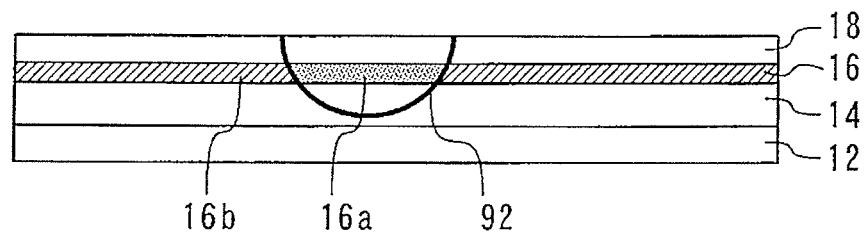
FIG. 27 is a cross-sectional view showing the laser device after the ZnO film has been removed.

Next, a portion of the active layer 16 is disordered, forming a disordered portion. This disordering is achieved in the following manner. First, a ZnO film is formed on a portion of the upper cladding layer 18. FIG. 25 is a cross-sectional view showing a ZnO film 90 thus formed. The laser device is then heated to form a Zn diffused region. FIG. 26 is a cross-sectional view showing a Zn diffused region 92 thus formed. As a result, the active layer 16 in the Zn diffused region 92 is disordered, forming the disordered portion 16a. The ZnO film 90 is then removed. FIG. 27 is a cross-sectional view showing the laser device after the ZnO film has been removed.

Figure 28:
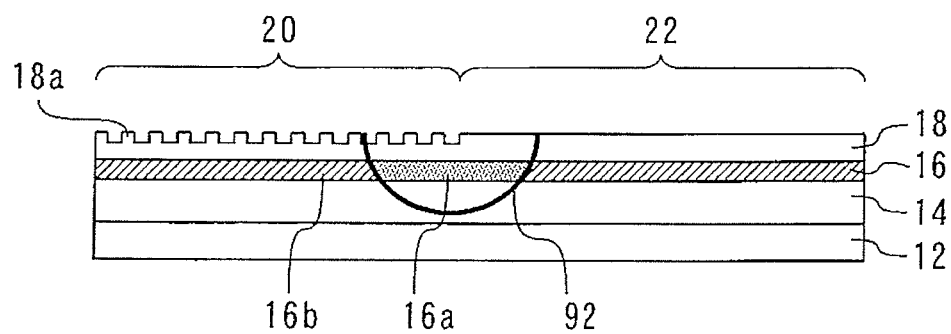
FIG. 28 is a cross-sectional view showing a diffraction grating is formed.

Next, a diffraction grating is formed in a portion of the upper cladding layer 18, which overlies the active layer. FIG. 28 is a cross-sectional view showing a diffraction grating 18a thus formed. The diffraction grating 18a is formed in such a manner that the disordered portion 16a intersects the boundary between the diffraction grating section 20 in which the diffraction grating 18a is formed and the bulk section 22 in which the diffraction grating 18a is not formed.

In accordance with the laser device manufacturing method of the fifth embodiment, the diffraction grating 18a is formed after the disordered portion 16a is formed, thus eliminating the possibility of the diffraction grating being affected by the heat used to form the disordered portion. In this way it is possible to maintain the shape of the diffraction grating.

The laser device manufacturing method of the fifth embodiment may be used to form a disordered end portion or a disordered under-diffraction-grating portion such as those described above, in addition to the disordered portion 16a. Further, the Si ion implantation technique described above in connection with the fourth embodiment may be used to form the disordered portion before the diffraction grating is formed. It should be noted that the laser device manufacturing method of the fifth embodiment is susceptible of at least alterations similar to those that can be made to the laser device manufacturing methods of the embodiments described above.

In accordance with the present invention there is provided a laser device in which a disordered portion is formed to intersect the boundary between a diffraction grating section in which a diffraction grating is formed and a bulk section in which the diffraction grating is formed, making it possible to reduce the optical density at the boundary.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2011-134345, filed on Jun. 16, 2011 including specification, claims, drawings and summary, on which the Convention priority of the present application is based, is incorporated herein by reference in its entirety.

What is claimed is:

1. A laser device having first and second opposed end faces, the laser device comprising:
   a substrate;
   a laminated semiconductor structure on said substrate, said laminated semiconductor structure comprising a plurality of semiconductor layers including
      a lower cladding layer,
      an active layer having a first disordered portion spaced from said first end face of said laser device and first and second non-disordered portions adjacent and sandwiching said first disordered portion, and
      an upper cladding layer located on said active layer; and
   a diffraction grating located in a portion of a layer of said laminated semiconductor structure, above or below said active layer, with respect to said substrate, said diffraction grating defining a diffraction grating section of said laser device, wherein
      said laser device includes a bulk section, free of any diffraction grating, adjacent said diffraction grating section at a boundary,
      said laser device includes a disordering impurity region, including a disordering impurity, extending through parts of said upper cladding layer, said active layer, and said lower cladding layer, and
      said disordering impurity region contains said first disordered portion of said active layer and the boundary between said diffraction grating section and said bulk section.

2. The laser device according to claim 1, wherein said active layer includes a second disordered portion, spaced from said first disordered portion by one of said first and second non-disordered portions of said active layer, and located at and including said second end face of said laser device.

3. The laser device according to claim 1, wherein said first disordered portion of said active layer is located directly below or directly above part of said diffraction grating, with respect to said substrate.

4. The laser device according to claim 1, wherein said disordering impurity region is disordered by one of Zn and Si.

5. A method of manufacturing a laser device, comprising:
forming a semiconductor laminated structure including an active layer and additional semiconductor layers on a substrate;
forming a diffraction grating in a portion of a layer of said semiconductor laminated structure that is located above or below said active layer with respect to said substrate, said diffraction grating defining a diffraction grating section of said laser device, said laser device including a bulk section, free of any diffraction grating and adjacent said diffraction grating section at a boundary; and
after forming said diffraction grating, forming a disordering impurity region in part of said semiconductor laminated structure, including a disordered portion of said active layer and leaving first and second non-disordered portions of said active layer adjacent and sandwiching said disordered portion of said active layer, said disordering impurity region containing the boundary between said diffraction grating section and said bulk section.

6. A method of manufacturing a laser device, comprising:
forming a semiconductor laminated structure including an active layer and additional semiconductor layers on a substrate;
forming a disordering impurity region in part of said semiconductor laminated structure, including forming a disordered portion of said active layer and leaving first and second non-disordered portions of said active layer adjacent and sandwiching said disordered portion of said active layer; and
after forming said disordering impurity region, forming a diffraction grating in a portion of a layer of said laminated semiconductor structure that is located above said active layer, with respect to said substrate, said diffraction grating defining a diffraction grating section of said laser device, said laser device including a bulk section, free of any diffraction grating and adjacent said diffraction grating section at a boundary, wherein forming said diffraction grating includes forming said diffraction grating so that said disordering impurity region contains the boundary between said diffraction grating section and said bulk section.

7. The method of manufacturing a semiconductor laser according to claim 5, including forming said disordering impurity region by diffusing an impurity into said laminated semiconductor structure.

8. The method of manufacturing a semiconductor laser according to claim 5, including forming said disordering impurity region by implanting an impurity into said laminated semiconductor structure.

9. The method of manufacturing a semiconductor laser according to claim 6, including forming said disordering impurity region by diffusing an impurity into said laminated semiconductor structure.

10. The method of manufacturing a semiconductor laser according to claim 6, including forming said disordering impurity region by implanting an impurity into said laminated semiconductor structure.

* * * * *

UNITED STATES PATENT AND TRADEMARK OFFICE
CERTIFICATE OF CORRECTION

PATENT NO. : 8,472,495 B2  
APPLICATION NO. : 13/402245  
DATED : June 25, 2013  
INVENTOR(S) : Takashi Motoda Page 1 of 1

It is certified that error appears in the above-identified patent and that said Letters Patent is hereby corrected as shown below:

Title Page, below Item (22)

Add:

(30)    Foreign Application Priority Data

June 16, 2011 (JP)................................2011-134345

Signed and Sealed this  
Third Day of September, 2013

Teresa Stanek Rea  
*Acting Director of the United States Patent and Trademark Office*